(12) United States Patent
Abel

(10) Patent No.: US 7,312,663 B2
(45) Date of Patent: Dec. 25, 2007

(54) PHASE-LOCKED LOOP HAVING A BANDWIDTH RELATED TO ITS INPUT FREQUENCY

(75) Inventor: Christopher J. Abel, Coplay, PA (US)

(73) Assignee: LSI Corporation, Milpitas, CA (US)

( * ) Notice: Subject to any disclaimer, the term of this patent is extended or adjusted under 35 U.S.C. 154(b) by 80 days.

(21) Appl. No.: 11/154,314

(22) Filed: Jun. 16, 2005

(65) Prior Publication Data

US 2006/0284687 A1   Dec. 21, 2006

(51) Int. Cl.
    *H03L 7/00* (2006.01)
(52) U.S. Cl. ............... 331/16; 331/17; 331/34; 331/177 R; 327/156
(58) Field of Classification Search ............ 331/16, 331/17, 34, 177 R; 327/156
    See application file for complete search history.

(56) References Cited

U.S. PATENT DOCUMENTS

| 5,382,922 A * | 1/1995 | Gersbach et al. ........... 331/1 A |
| 5,504,459 A * | 4/1996 | Gersbach et al. ........... 331/17 |
| 5,696,468 A * | 12/1997 | Nise ........................... 331/14 |
| 5,942,949 A | 8/1999 | Wilson et al. |
| 6,933,798 B2 * | 8/2005 | Hammes et al. ............ 332/127 |
| 2005/0185749 A1 * | 8/2005 | Convent et al. ............ 375/376 |

OTHER PUBLICATIONS

Maneatis, John G.; "Low-Jitter Process-Independent DLL and PLL Based on Self-Biased Techniques"; IEEE Journal of Solid-State Circuits; Nov. 1996; pp. 1723-1732; vol. 31, No. 11; USA.

\* cited by examiner

*Primary Examiner*—Robert Pascal
*Assistant Examiner*—Levi Gannon

(57) ABSTRACT

An integrated circuit includes a phase-locked loop (PLL) in which the loop bandwidth of the PLL is proportional to the input frequency of the PLL. The PLL includes a phase/frequency detector (PFD), a charge pump, a loop filter, and a voltage-controlled oscillator (VCO) that generates the PLL output clock. The VCO includes a current scaling block that scales the sum of a variable current, which is proportional to the loop filter voltage, and a fixed current. The frequency of the PLL output clock is a function of the current output from the current scaling block. Since the same scaling factor is applied to both the fixed current and the variable current, the gain from the loop filter voltage to the PLL output frequency is proportional to the PLL output frequency, and thus the loop bandwidth of the PLL is proportional to the PLL input frequency.

10 Claims, 5 Drawing Sheets

PHASE-LOCKED LOOP HAVING A BANDWIDTH RELATED TO ITS INPUT FREQUENCY

BACKGROUND OF THE INVENTION

1. Field of the Invention

The invention relates to phase-locked loop (PLL) circuits. More particularly, the invention relates to a PLL whose loop bandwidth replicates or tracks its input frequency.

2. Description of the Related Art

A phase-locked loop (PLL) is a circuit that generates a periodic output signal, or clock, that has a constant phase relationship with a periodic input signal. PLLs are closed loop frequency control systems whose operation depends on the detection of the phase difference between the input and output signals of the circuit, and which are used in many types of measurement, microprocessor and communication applications. Often, PLLs are used to generate clocks, or to recover clocks from received data in such applications.

Typically, a conventional PLL used for clock generation includes a phase/frequency detector (PFD), a charge pump, a loop filter, a voltage-controlled oscillator (VCO) or current-controlled oscillator (ICO), which generates the PLL output clock, and a frequency divider.

The PFD measures the difference in phase between an input clock and a feedback clock, which may be the PLL output clock itself, or a clock generated by passing the PLL output clock through a frequency divider. The PFD generates an error signal that is proportional to this measured phase difference, and the charge pump generates a current that is proportional to this error signal. The charge pump current is input to the loop filter, and the loop filter outputs a voltage that is input to the VCO. The frequency of the PLL output clock generated by the VCO is controlled by the loop filter voltage.

Under proper conditions, the loop characteristics will be such that the phase and frequency of the feedback clock derived from the PLL output clock will exactly equal the frequency and phase of the PLL input clock. In this condition, the PLL is said to be "locked". Once the PLL is locked, if the phase of the input clock varies in time, then the phase of the output clock will track it, thus keeping the phase of the feedback clock equal to the phase of the input clock.

The ability of a PLL to track variations in the phase of its input clock is quantified by a measure known as the PLL jitter transfer function. The jitter transfer function of a PLL is essentially lowpass in nature; the output phase of the PLL will fully track low frequency variations in the input phase, but will only partially track, or not track at all, high frequency variations in input phase. An important quantity associated with the jitter transfer function is the closed loop bandwidth of the PLL. The closed loop bandwidth of a PLL is the frequency of phase modulation at which the magnitude of the jitter transfer function drops by 3 dB from its low frequency limit.

In addition to providing an indication of the upper limit of the input phase modulation frequency which can be fully tracked by the PLL, it is also known that the closed loop bandwidth quantifies the ability of the PLL to attenuate random noise originating within the VCO. Specifically, VCO phase noise is attenuated at frequencies below the PLL loop bandwidth, and passed at frequencies above the loop bandwidth. Since VCO phase noise is a significant source of jitter in most PLLs used in clock generator applications, maximizing the loop bandwidth is a desirable characteristic for most PLLs.

However, in order for the PLL loop to be stable, the loop bandwidth of the PLL is limited to a small fraction of the frequency of the PLL input clock. Specifically, it is widely agreed upon that the loop bandwidth should not significantly exceed 10% of the PLL input clock frequency. Thus, in order to maintain an adequate loop stability margin, while still attenuating VCO phase noise as much as possible, making the loop bandwidth a substantially constant fraction of the PLL input frequency (e.g. 10%) over a specified range of input frequencies is a desirable design goal for most PLLs used in clock synthesizer applications.

In addition to random noise within the VCO, noise on the loop filter voltage, which controls the frequency of the VCO, is also a significant source of jitter in many PLLs. To reduce this noise, it is desirable that the VCO gain, $K_{VCO}$, which is defined as the ratio of the change in PLL output frequency to a small change in loop filter voltage, be minimized. However, in many clock synthesizer applications, it is also desirable that a single PLL be capable of operating over a wide range of output frequencies. In a standard charge-pump PLL, the required operating range places a lower limit on the VCO gain. Specifically $K_{VCO}$ must meet the following requirement $$K_{VCO} > \frac{\Delta F_{VCO}}{\Delta V_{LF}}$$

where $\Delta F_{VCO}$ is the difference between the required maximum and minimum operating frequencies for the PLL output clock, and $\Delta V_{LF}$ is the peak-to-peak range of the loop filter voltage. In many applications, this minimum $K_{VCO}$ may be a much higher gain than is compatible with the requirement for low jitter. Thus, for applications which require a low-jitter PLL that also covers a wide operating range, it is desirable to choose an architecture in which the VCO gain is independent of the operating frequency range.

U.S. Pat. No. 5,942,949 discloses a PLL with an oscillator architecture that includes autotrim. Autotrim is a feature or procedure that calibrates the center frequency of the VCO, which is defined as the operating frequency of the oscillator when the loop filter voltage is equal to a suitable reference voltage, during a power-up or reset state of the PLL. This autotrim feature allows the PLL to operate across a relatively wide output frequency range while still maintaining a relatively low VCO gain. However, in the PLL architecture disclosed in U.S. Pat. No. 5,942,949, the loop bandwidth does not replicate or track the input frequency, i.e., the update rate of the PFD, and thus the VCO phase noise is not optimally attenuated when the PLL is used over a wide range of input frequencies.

The article "Low-Jitter Process-Independent DLL and PLL Based on Self-Biased Techniques," IEEE Journal of Solid-State Circuits, Vol. 31, No. 11, November 1996, describes self-biasing PLL designs in which the loop bandwidth tracks the PLL input frequency. However, in these PLLS, the VCO gain must be large enough to allow the PLL to operate across a relatively wide range of operating frequencies and to compensate for process and temperature variations. Such a large VCO gain disadvantageously increases the sensitivity of the output jitter of the PLL to various noise sources, including noise in the loop filter voltage.

Accordingly, it would be desirable to have available a PLL with a relatively wide input and output operating frequency range, a relatively low VCO gain that is substantially independent of the operating output frequency range, and a loop bandwidth that tracks its input frequency.

SUMMARY OF THE INVENTION

The invention is embodied in an integrated circuit including a phase-locked loop (PLL) in which the loop bandwidth of the PLL tracks or is proportional to the input frequency of the PLL. The PLL includes a phase/frequency detector (PFD), a charge pump, a loop filter, and a voltage-controlled oscillator (VCO), which generates the clock that is the output of the PLL. A feedback path between the VCO and the PFD allows the PFD to compare the output phase and frequency, $F_{VCO}$, of the PLL clock, or the phase and frequency of a clock divided down from the PLL clock, to the phase and frequency, $F_{IN}$, of an input or reference signal. The PFD generates an error signal based on this comparison and the error signal, after being filtered by the loop filter, acts as a control voltage input to the VCO. The output frequency of the PLL clock is adjusted based on this control voltage so that, in steady state, there is a fixed relationship between $F_{VCO}$ and $F_{IN}$ and a fixed relationship between the phases of the input signal and PLL output clock. According to embodiments of the invention, the VCO includes a current scaling block that scales the sum of a fixed reference current $I_{FIXED}$ and a VCO control current $I_{GM}$, which is proportional to the loop filter voltage $V_{LF}$, by a scaling factor A to generate an input bias current $I_{CELL}$, which controls the PLL output frequency $F_{VCO}$. The current scaling block also has a center frequency control input that adjusts the scaling factor A in such a way that the gain $K_{VCO}$ of the VCO is proportional to $F_{VCO}$ when $I_{GM}=0$. As a result, the loop bandwidth of the PLL circuit is proportional to the frequency of the input signal, $F_{IN}$. In addition, the center frequency control allows the PLL to operate over a wide frequency range, where said operating range is independent of the VCO gain.

DETAILED DESCRIPTION OF EXEMPLARY EMBODIMENTS

Figure 1:
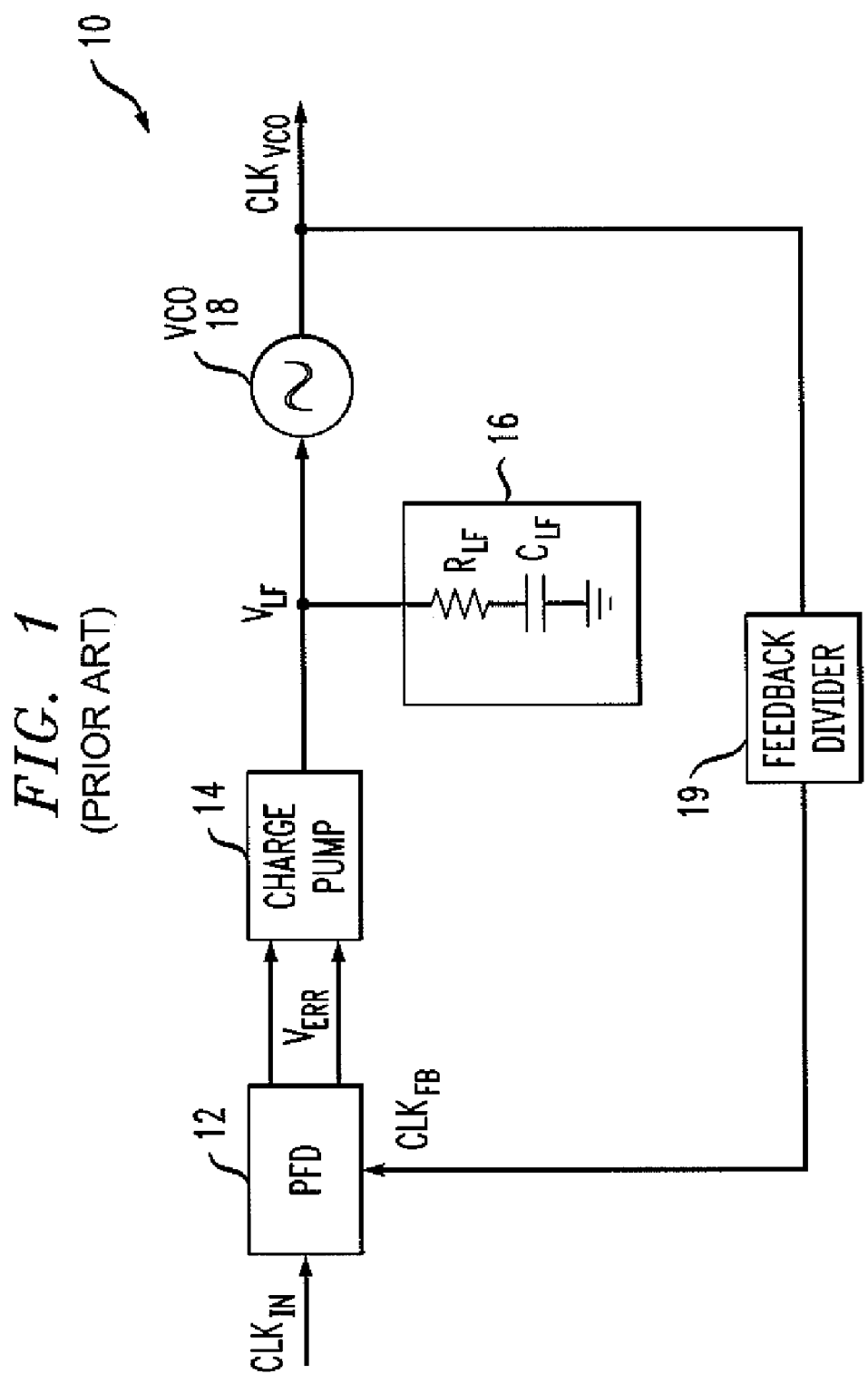
FIG. 1 is a simplified schematic diagram of a conventional phase-locked loop (PLL) circuit.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

Referring now to FIG. 1, shown is a simplified schematic diagram of a conventional phase-locked loop (PLL) 10. As discussed previously herein, a PLL is a circuit that generates a periodic output signal, or clock, that has a constant phase and frequency relationship with respect to a periodic input signal. The PLL 10 includes a phase/frequency detector (PFD) 12, a charge pump 14, a loop filter 16, a voltage-controlled oscillator (VCO) 18, and a feedback frequency divider 19.

The PFD 12 compares the phase and frequency of an input signal or reference clock signal $CLK_{IN}$ to the phase and frequency of a feedback signal $CLK_{FB}$ and generates a pulse-width modulated error signal, $V_{ERR}$, having a sign and pulse width that is indicative of the phase difference between the two signals. The error signal is an up or positive signal when the phase ($\theta_{IN}$) of the input signal leads the phase ($\theta_{FB}$) of the feedback signal and a down or negative signal when the phase $\theta_{IN}$ lags the phase $\theta_{FB}$. Furthermore, the magnitude of $V_{ERR}$ is proportional to the phase difference, $\theta_{IN}-\theta_{FB}$.

The charge pump 14 generates an amount of charge proportional to the error signal and inputs this charge to the loop filter 16. The loop filter 16 is embodied in a resistor, $R_{LF}$, and capacitor, $C_{LF}$, connected in series. Other, more complex loop filter configurations are possible, however, this configuration is very widely used in charge pump PLLs. The loop filter 16 accumulates the net charge from the charge pump 14 and generates a voltage, $V_{LF}$. The voltage output from the loop filter 16, $V_{LF}$, is input to the VCO 18.

The VCO 18 generates a periodic output or operating signal, $CLK_{VCO}$, which is the output of PLL 10. The frequency, $F_{VCO}$, of $CLK_{VCO}$ is controlled by the loop filter voltage $V_{LF}$.

The VCO output signal $CLK_{VCO}$ is used to generate the feedback signal $CLK_{FB}$ to the PFD 12. The feedback signal may be generated using an optional frequency divider circuit (shown generally as 19), having a divisor N. In this case, $F_{FB}=F_{VCO}/N$. Similarly, an additional divider circuit (not shown) may be used to generate the input signal $CLK_{IN}$ from a higher frequency clock.

When the PLL is locked, the feedback path between the VCO 18 and the PFD 12 adjusts the frequency and phase of the clock output from the PLL 10, $CLK_{VCO}$, such that the frequency and phase of the feedback clock are equal to the frequency and phase of the input signal, that is, $F_{FB}=F_{IN}$ and $\theta_{FB}=\theta_{IN}$. Thus, when the PLL 10 is locked, the loop filter voltage $V_{LF}$ is such that the frequency of the PLL output clock is equal to $F_{VCO}=N \times F_{IN}$.

As discussed previously herein, in order to reduce the impact of random oscillator phase noise on PLL jitter as much as possible, it is desirable that the closed loop bandwidth of a PLL track or be proportional to the frequency of the PLL input clock. Further, in order to reduce the impact of noise coupled from outside the PLL into the loop filter voltage on PLL jitter it is also desirable that the VCO gain be reduced. In most prior art PLLs, the closed loop bandwidth $F_{3db}$ does not accurately track the input frequency $F_{IN}$, and the few PLL architectures that do have this desirable feature typically require that the gain of the VCO be undesirably large.

According to embodiments of the invention, a PLL is disclosed that has a relatively low VCO gain ($K_{VCO}$) that is independent of the required output frequency range of the PLL, and a closed loop bandwidth that is proportional to the input frequency of the PLL. The PLL includes an adjustable or programmable current scaling block with a center frequency control input for selecting the scaling factor of the current scaling block. The current scaling block scales a VCO control current $I_{GM}$ and a VCO reference current $I_{FIXED}$ by the same scale factor, which causes the gain of the VCO to be proportional to the output frequency of the VCO, which also is the frequency of the output clock of the PLL. As will be shown in detail hereinbelow, the addition of the current scaling block causes the loop bandwidth of the PLL to be proportional to its input frequency.

Figure 2:
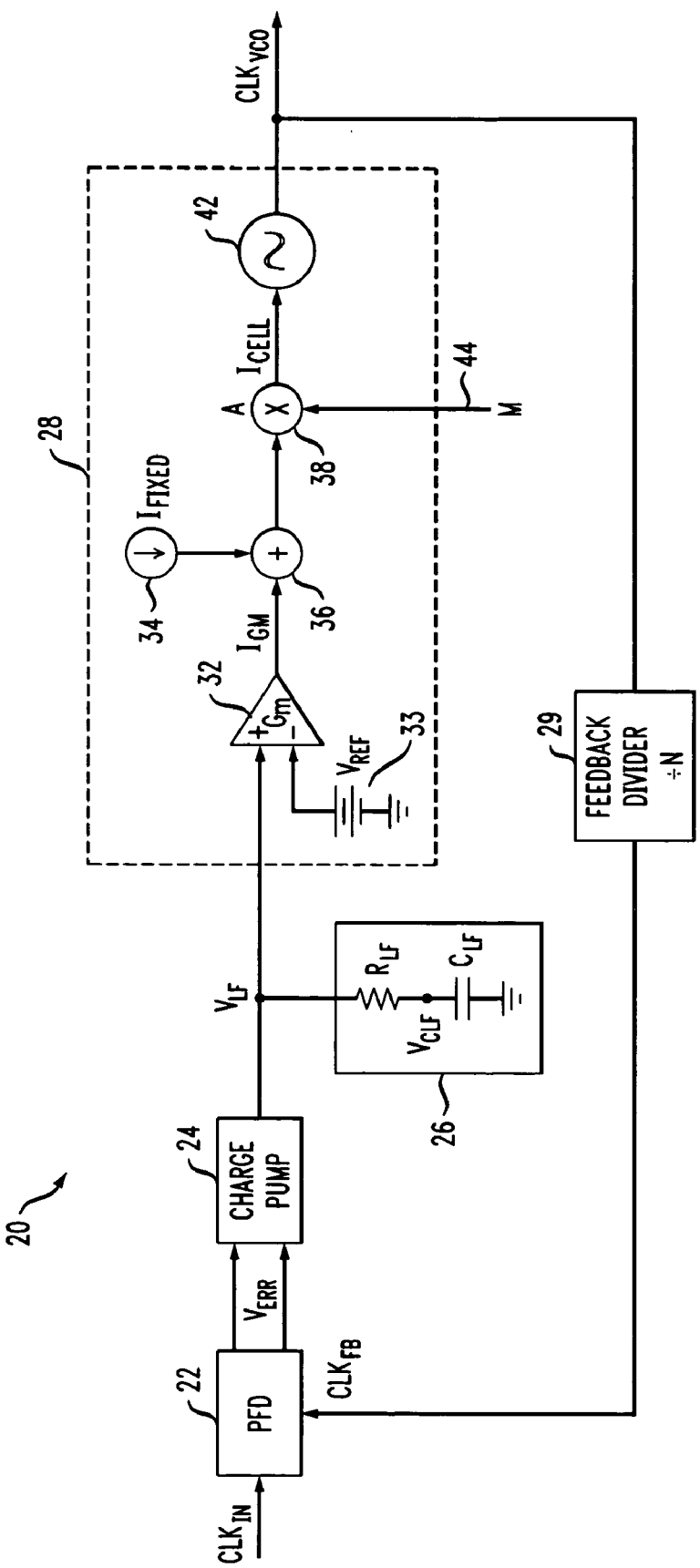
FIG. 2 is a simplified schematic diagram of a phase-locked loop circuit according to embodiments of the invention.

Referring now to FIG. 2, shown is a simplified schematic diagram of a phase-locked loop (PLL) 20 according to embodiments of the invention. As in the previously described conventional PLL 10 shown in FIG. 1, PLL 20 includes a phase/frequency detector (PFD) 22, a charge pump 24, a loop filter 26, a voltage-controlled oscillator (VCO) 28, and an optional divider circuit 29 in the feedback path between the VCO 28 and the PFD 22.

According to embodiments of the invention, the PLL 20 is comprised of any suitable structure or arrangement, e.g., one or more integrated circuits. Alternatively, one or more of the components comprising the PLL 20 is comprised of any suitable structure or arrangement, e.g., one or more integrated circuits. Similarly, one or more of the components comprising the VCO 28 is comprised of any suitable structure or arrangement, e.g., one or more integrated circuits.

According to embodiments of the invention, VCO 28 includes a transconductor or voltage to current (V/I) converter 32, a local reference voltage source 33, a reference current source 34, a current summing node 36, a current scaling block 38, and a local or core oscillator 42.

The V/I converter 32 has two inputs, a noninverting input and an inverting input. The noninverting input of V/I converter 32 is the VCO input voltage, and is thus coupled to the loop filter voltage, $V_{LF}$. The inverting input is coupled to local reference voltage source 33, $V_{REF}$. The output of the V/I converter 32 is the VCO control current $I_{GM}$, which is equal to $G_M \times (V_{LF} - V_{REF})$, where $G_M$ is the gain or transconductance of the V/I converter 32.

The output voltage, $V_{REF}$, of local reference voltage source 33 may be any value, including 0, but in the preferred embodiment it has a value approximately equal to the center of the charge-pump output voltage range.

The reference current source 34 couples a fixed current $I_{FIXED}$ to the current summing node 36, as shown. The VCO control current $I_{GM}$ also is coupled to the current summing node 36. The current summing node 36 supplies the sum of the two currents to the current scaling block 38.

The current scaling block 38, which has an adjustable or programmable gain or scaling factor A, scales the current input thereto by the scaling factor A. Therefore, the output of the current scaling block 38, $I_{CELL}$, which is the input bias current to the core oscillator 42, is equal to $A \times (I_{FIXED} + I_{GM})$. That is, $$I_{CELL} = A(I_{FIXED} + I_{GM}) = A(I_{FIXED} + G_M(V_{LF} - V_{REF}))$$

In this embodiment, the frequency of core oscillator 42, $F_{VCO}$, is controlled by $I_{CELL}$, and the center frequency of VCO 28, $F_0$, is defined as the value $F_{VCO}$ when $V_{LF} = V_{REF}$; that is, when $I_{CELL} = A \times I_{FIXED}$. The adjustable scaling factor, A, thus provides a mechanism to adjust the center frequency of VCO 28.

The programmable gain A of the current scaling block 38 is controlled by a center frequency control input M (shown generally as 44). As will be discussed in greater detail hereinbelow, according to embodiments of the invention, the center frequency control input 44 is adjusted manually. Alternatively, as also will be discussed in greater detail hereinbelow, according to alternative embodiments of the invention, the center frequency control input 44 is adjusted by an optional autotrim circuit, or is adjusted continuously based on the voltage of the loop filter capacitor $C_{LF}$, i.e., $V_{CLF}$.

Given the PLL 20 shown in FIG. 2, the following discussion and corresponding equations will show that the closed loop bandwidth $F_{3dB}$ of the PLL 20 tracks or is proportional to the frequency $F_{IN}$ of the input clock to PLL 20. By modeling the PLL 20 using conventional frequency-domain models, it can be shown that the closed loop bandwidth or −3 dB bandwidth of the jitter transfer function of the PLL is approximately equal to $$F_{3dB} \approx \frac{I_{CP} R_{LF} K_{VCO}}{2\pi N}$$

where $I_{CP}$ is the current of the charge pump 24, $R_{LF}$ is the resistance of loop filter 26, N is the divisor of feedback divider 29, and $K_{VCO}$ is the gain of the VCO.

From the foregoing relationship, and from it being known that, when PLL 20 is locked, $F_{VCO} = N \times F_{IN}$, then the ratio $F_{3dB}/F_{IN}$ may be written:

$$\frac{F_{3dB}}{F_{IN}} = \frac{\frac{I_{CP} R_{LF} K_{VCO}}{2\pi N}}{\frac{F_{VCO}}{N}} = \frac{I_{CP} R_{LF} K_{VCO}}{2\pi F_{VCO}}$$

In the foregoing equations, $I_{CP}$, $R_{LF}$ and the divisor N are constants. Therefore, if it is shown that the VCO gain $K_{VCO}$ is proportional to the VCO output signal $F_{VCO}$, i.e., if $K_{VCO} \propto F_{VCO}$, then it follows that the loop bandwidth $F_{3dB}$ is proportional to the input signal $F_{IN}$, i.e., $F_{3dB} \propto F_{IN}$. One VCO that has the characteristic $K_{VCO} \propto F_{VCO}$ and thus is suitable for use in PLL 20 is the VCO described in the co-pending application "Voltage-Controlled Oscillator With Gain Proportional To Operating Frequency," Ser. No. 11/071,707, filed on Mar. 3, 2005 and assigned to the assignee of this application.

According to embodiments of the invention, the VCO 28 is such that the core oscillator 42 is a current-controlled oscillator whose operating frequency $F_{VCO}$ is proportional to any nonzero real power of the oscillator bias current $I_{CELL}$. That is, $$F_{VCO} = B I_{CELL}^\alpha = B[A(G_M(V_{LF} - V_{REF}) + I_{FIXED})]^\alpha$$

where B is a proportionality constant, α is any real number other than zero (0), A is the scaling factor of the current scaling block 38, and $G_M$ is the gain of the V/I converter 32. In one embodiment, the core oscillator 42 is a member of the class of complementary metal oxide semiconductor (CMOS) ring oscillators for which α=½, i.e., the operating frequency of core oscillator 42 is proportional to the square root of the oscillator bias current $I_{CELL}$.

The VCO gain $K_{VCO}$ is:

$$K_{VCO} \equiv \frac{dF_{VCO}}{dV_{LF}} = \frac{dF_{OUT}}{dI_{CELL}} \frac{dI_{CELL}}{dV_{LF}} = A G_M \frac{dF_{OUT}}{dI_{CELL}}$$

From the previous expression for the operating frequency of the core oscillator 42:

$$\frac{dF_{OUT}}{dI_{CELL}} = \alpha B I_{CELL}^{\alpha-1} = \alpha \frac{F_{OUT}}{I_{CELL}} = \alpha \frac{F_{OUT}}{A(G_M(V_{LF} - V_{REF}) + I_{FIXED})}$$

Assuming that the control current $I_{GM}$ (i.e. $G_M(V_{LF}-V_{REF})$) is much less than the reference current $I_{FIXED}$ supplied by reference current source 34 (i.e., $I_{GM} \ll I_{FIXED}$), the above equation simplifies approximately to:

$$\frac{dF_{OUT}}{dI_{CELL}} \approx \alpha \frac{F_{OUT}}{AI_{FIXED}}$$

Thus, substituting this assumed approximation into the previous expression for $K_{VCO}$:

$$K_{VCO} = AG_M \frac{dF_{OUT}}{dI_{CELL}} = \frac{\alpha G_M}{I_{FIXED}} F_{OUT}$$

Then, substituting $K_{VCO}$ back into the previous expression for $F_{3dB}$:

$$\frac{F_{3dB}}{F_{IN}} = \frac{I_{CP}R_{LF}K_{VCO}}{2\pi F_{OUT}} = \frac{I_{CP}R_{LF}\alpha G_M}{2\pi I_{FIXED}}$$

Since all quantities on the on the right-hand side of this expression are constants, it follows that $F_{3dB}$ is proportional to the input signal $F_{IN}$, that is, $$F_{3dB} \propto F_{IN}$$

Figure 3:
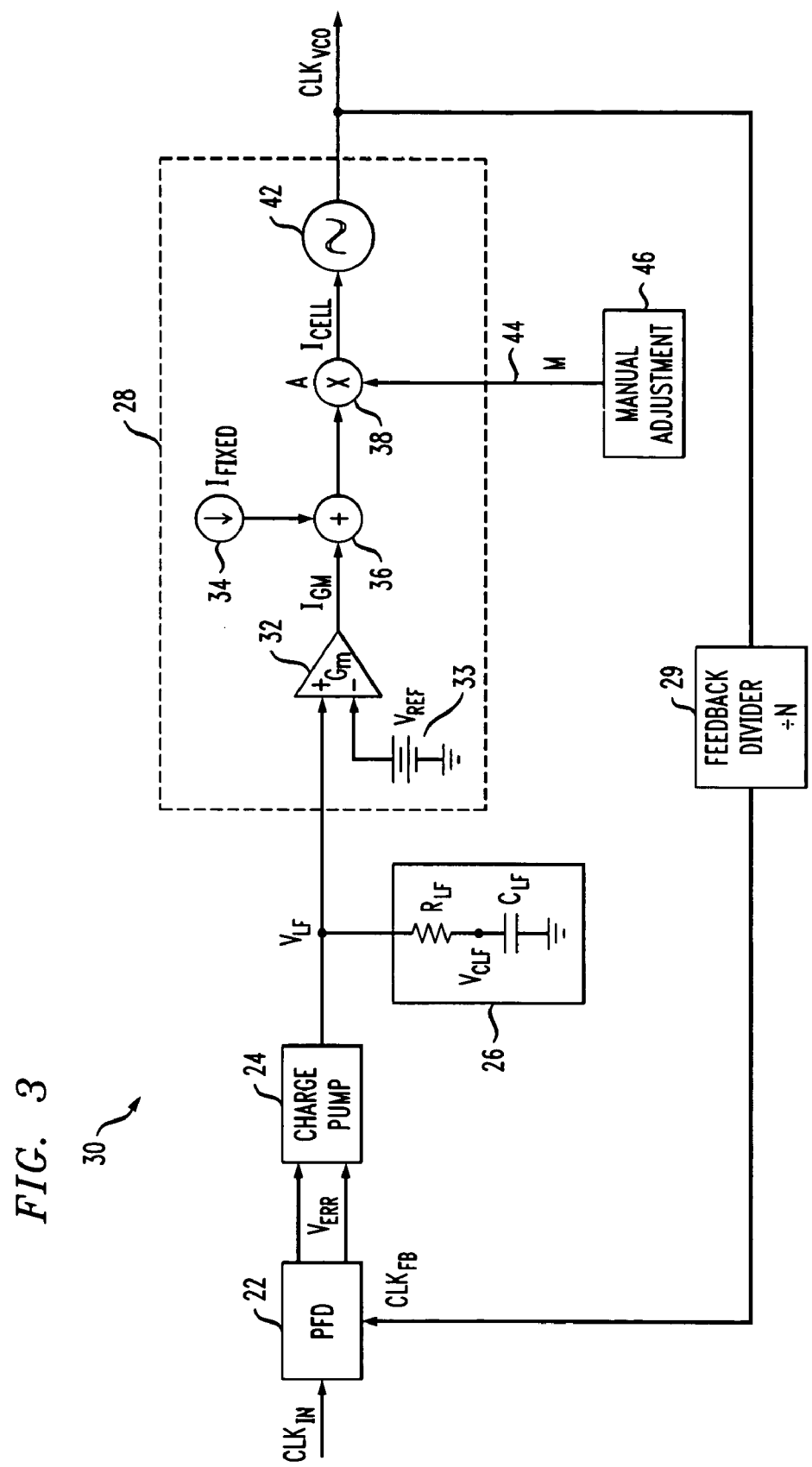
FIG. 3 is a simplified schematic diagram of a phase-locked loop circuit according to an alternative embodiment of the invention.

Referring now to FIG. 3, shown is a simplified schematic diagram of a phase-locked loop (PLL) 30 according to an alternative embodiment of the invention. In this embodiment of the invention, the center frequency control 44 is adjusted manually by a suitable manual adjustment device (shown generally as 46). For example, the manual adjustment device 46 may be an L-bit digital control word, whose value can be set by manually by the user, which sets the gain A of current scaling block 38 to one of $2^L$ values. In this embodiment, the manual adjustment device 46 is not coupled to any other components in the PLL 30 and therefore is not controlled or influenced by any signal in the PLL 30.

Figure 4:
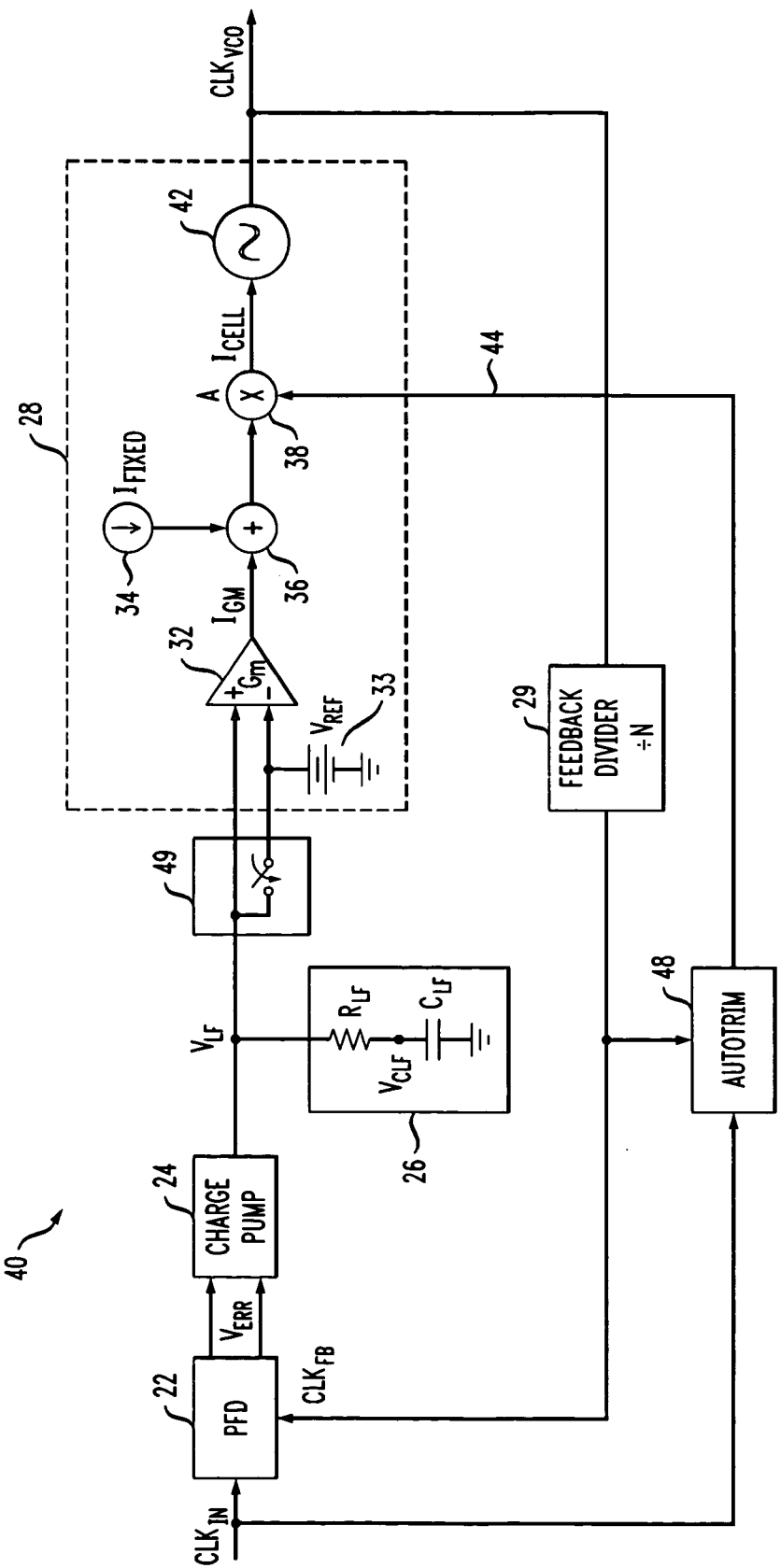
FIG. 4 is a simplified schematic diagram of a phase-locked loop circuit according to another alternative embodiment of the invention.

Referring now to FIG. 4, shown is a simplified schematic diagram of a phase-locked loop (PLL) 40 according to another alternative embodiment of the invention. In this embodiment, PLL 40 includes an autotrim or trimming circuit or logic 48 that controls or adjusts the center frequency control 44. The inputs to autotrim circuit 48 are the PLL input clock, $CLK_{IN}$, and the feedback clock, $CLK_{FB}$. The outputs of autotrim circuit 48 are center frequency control 44 and a signal which controls switch 49.

In operation, during a power-up or reset of PLL 40 or during a production test of the core oscillator 42, autotrim circuit 48 opens the loop of PLL 40 by closing switch 49, which forces the loop filter voltage to be equal to the same reference voltage that is coupled to the inverting input to V/I converter 32. With $V_{LF}=V_{REF}$, the output current from V/I converter 32 is equal to $I_{GM}=0$, and the frequency of the PLL output clock, $F_{VCO}$, will be equal to the previously defined center frequency, $F_0$. Then, autotrim circuit 48 adjusts the value of the bias current of core oscillator 42, which is given by $I_{CELL}=A \times I_{FIXED}$, by changing the gain A of current scaling block 38 through an adjustment to center frequency control 44. After each adjustment, autotrim circuit 48 compares the frequency $F_{FB}$ of the feedback clock to the frequency $F_{IN}$ of the PLL input clock. It then continues making adjustments to center frequency control 44, and thus to the gain A, until the frequency of the PLL output clock, $F_{VCO}=F_0$, is as close as possible to $N \times F_{IN}$.

Once the center frequency of core oscillator 42 has been adjusted appropriately, autotrim circuit 48 opens switch 49, allowing normal operation of PLL circuit 40 to resume. As PLL 40 locks to the input clock, $V_{LF}$ will settle above or below $V_{REF}$, depending on whether the PLL output frequency, $N \times F_{IN}$, is above or below the center frequency set during the autotrim procedure. In general, autotrim circuit 48 allows core oscillator 42 to operate across a relatively wide frequency range, while still maintaining a relatively low VCO gain, $K_{VCO}$, that is independent of the operating frequency range.

Figure 5:
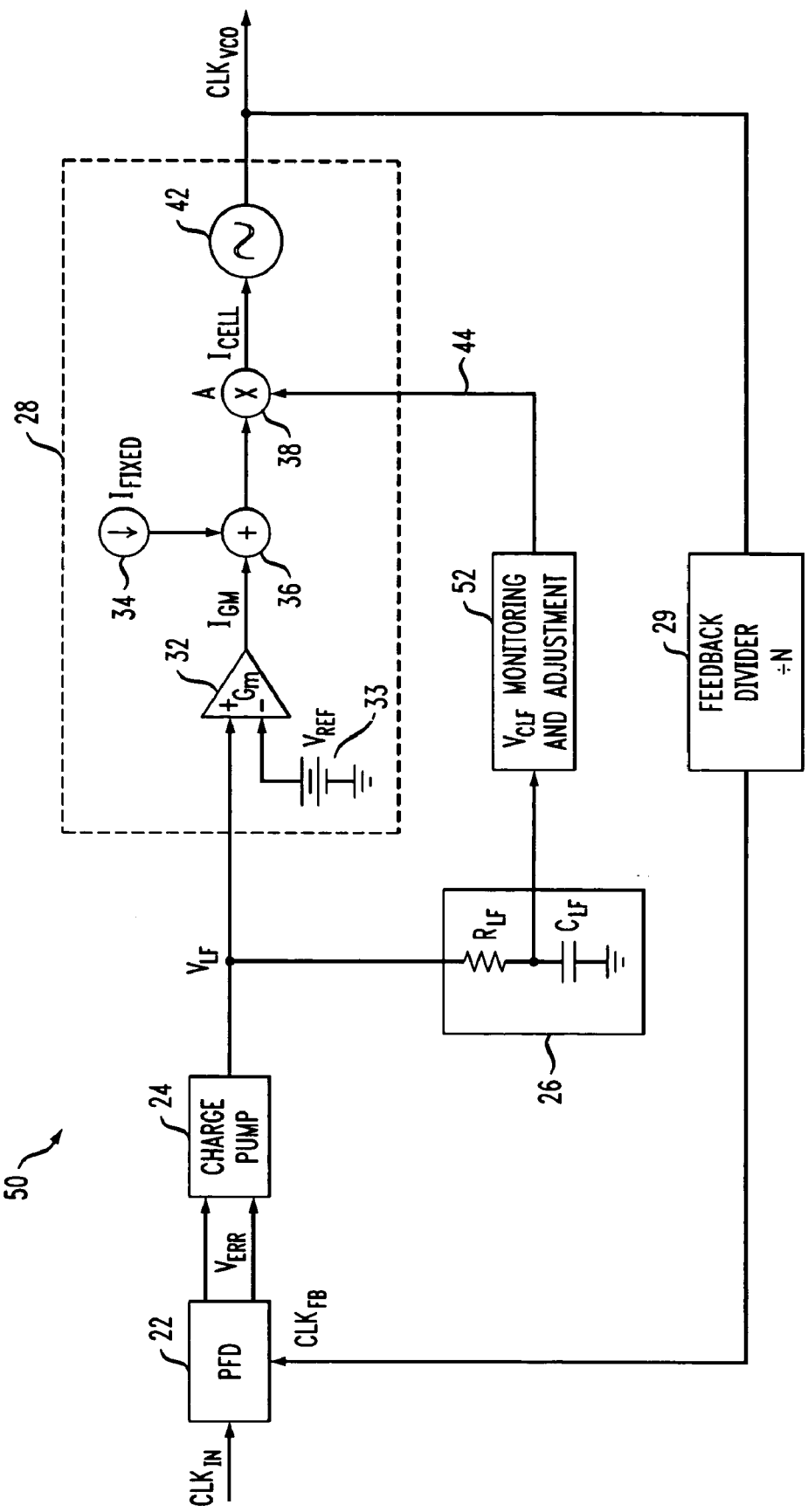
FIG. 5 is a simplified schematic diagram of a phase-locked loop circuit according to yet another alternative embodiment of the invention.

Referring now to the FIG. 5, shown is a simplified schematic diagram of a phase-locked loop (PLL) 50 according to yet another alternative embodiment of the invention. In this alternative embodiment of the invention, the PLL 50 includes adjustment circuit 52, coupled to the loop filter capacitor $C_{LF}$, that monitors the voltage across the loop filter capacitor $C_{LF}$ (i.e., $V_{CLF}$) and adjusts the center frequency of the core oscillator 42 based on the voltage potential across the loop filter capacitor $C_{LF}$.

In the exemplary embodiment, the resistor and capacitor that comprise the loop filter form a lowpass filter, and thus the voltage across the loop filter capacitor, $VC_{LF}$, is substantially equal to the time average of the loop filter voltage, $V_{LF}$. As explained in a previous paragraph, when PLL 50 is locked, if the frequency of the PLL output clock, $F_{VCO}$, is different from the VCO center frequency, $F_0$, then the voltage across the loop filter capacitor will be approximately equal to $$V_{CLF} \approx \frac{F_{VCO} - F_0}{K_{VCO}} + V_{REF}$$

If $V_{CLF} > V_{REF}$, the PLL operating frequency is greater than the VCO center frequency, while if $V_{CLF} < V_{REF}$, the PLL operating frequency is less than the VCO center frequency.

In the exemplary embodiment, adjustment circuit 52 includes suitable components for determining whether the voltage across the loop filter capacitor $C_{LF}$ is within a suitable voltage range. In one embodiment, it includes a first analog comparator, which compares $V_{CLF}$ with a high reference voltage, $V_{HREF}$, and a second analog comparator, which compares $V_{CLF}$ with a low reference voltage, $V_{LREF}$. The adjustment circuitry 52 typically also includes suitable components, such as a state machine or other suitable circuitry or logic, for adjusting the center control frequency of the core oscillator 42. If the voltage across the loop filter capacitor $C_{LF}$ is within the suitable range, that is $V_{LREF} < V_{CLF} < V_{HREF}$, the state machine or other suitable circuitry typically does not adjust the center control frequency of the core oscillator 42. However, if the voltage across the loop filter capacitor $C_{LF}$ is detected or determined to be outside of the established range, the adjustment circuitry 52 will be directed to adjust the center control frequency of the core oscillator 42 until the output of the core oscillator 42 and the feedback loop of the PLL circuit 50 cause the loop filter voltage $V_{LF}$ to change in such a way that the voltage $V_{CLF}$ across the loop filter capacitor $C_{LF}$ is back within the suitable range. In the exemplary embodiment, if $V_{CLF} > V_{HREF}$, adjustment circuit 52 increases the gain, A, of current scaling block 38, which in turn increases the center frequency $F_0$. If $V_{CLF} < V_{LREF}$, adjustment circuit 52 decreases the gain, A, of current scaling block 38, which in turn decreases the center frequency $F_0$.

Embodiments of the invention thus far described use a current-controlled oscillator as the core oscillator 42. These embodiments are especially useful in integrated circuits, as the current summing node 36 and the current scaling block 38 are efficiently implemented in integrated circuits by using current mirrors. However, those skilled in the art will recognize that other embodiments of the invention may be created by using a voltage-controlled oscillator as the core oscillator, and by replacing the current summing node and current scaling block with a voltage summing node and a voltage scaling block.

It will be apparent to those skilled in the art that many changes and substitutions can be made to the embodiments of the invention herein described without departing from the spirit and scope of the invention as defined by the appended claims and their full scope of equivalents.

The invention claimed is:

1. An integrated circuit including a phase-locked loop (PLL) circuit, the PLL circuit having a loop bandwidth, comprising:
   a phase/frequency detector (PFD) configured to generate an error signal that is proportional to the difference between the phase of a PLL input signal and the phase of a signal coupled to a feedback input;
   a feedback path, through which the PLL output clock is coupled to the feedback input of the PFD;
   a charge pump coupled to the output of the PFD that generates a current that is proportional to the error signal output by the PFD;
   a loop filter coupled to the output of the charge pump, which filters the charge pump current and generates a loop filter voltage;
   a voltage-controlled oscillator (VCO), which is coupled to the loop filter output, and which generates a PLL output clock, wherein the frequency of the PLL output clock is proportional to a non-zero real power of a VCO bias current; and
   wherein the VCO includes a current scaling block for scaling the sum of a VCO control current, which is proportional to the loop filter voltage, and a fixed reference current by a scaling factor to generate the VCO bias current, wherein the current scaling block has a center frequency control input for selecting the scaling factor; and
   wherein the VCO has a characteristic gain from the loop filter voltage to the frequency of the PLL output clock; and
   wherein said VCO bias current adjusts the frequency of the PLL output clock in such a way that the gain of the VCO is proportional to the PLL output frequency and the loop bandwidth of the PLL circuit is proportional to the frequency of the PLL input signal.

2. The integrated circuit as recited in claim 1, further comprising an autotrim logic block, which has a first input terminal coupled to the PLL input signal and a second input terminal coupled to the feedback signal, and which has an output that is coupled to the center frequency control input of the current scaling block, wherein said autotrim logic block adjusts the scale factor of the current scaling block in such a way as to minimize the difference between the frequency of the PLL input signal and the frequency of the feedback signal, while the loop filter voltage is forced to be equal to a specified reference voltage.

3. The integrated circuit as recited in claim 1, further comprising manual adjustment logic coupled to the current scaling block for manually adjusting the center frequency control input of the current scaling block.

4. The integrated circuit as recited in claim 1, wherein the loop filter includes a loop filter capacitor, and wherein the integrated circuit further comprises adjustment logic coupled between a portion of the loop filter and the current scaling block for adjusting the center frequency control input of the current scaling block based on the voltage across the effective loop filter capacitor.

5. The integrated circuit as recited in claim 1, wherein the VCO further comprises:
   a core oscillator that generates the PLL output clock having a frequency that is proportional to a non-zero real power of the current output from the current scaling block;
   a transconductor coupled to the loop filter that generates a VCO control current that is proportional to the loop filter voltage; and
   a current summing node for coupling the VCO control current and a fixed reference current into the current scaling block in such a way that the VCO control current is scaled by the same scaling factor as the fixed reference current.

6. The integrated circuit as recited in claim 5, wherein the VCO further comprises a reference current source coupled to the current summing node for generating the fixed reference current.

7. The integrated circuit as recited in claim 1, wherein the current scaling block is programmable.

8. The integrated circuit as recited in claim 1, wherein the core oscillator is selected from the group consisting of a ring oscillator, a relaxation oscillator, a crystal oscillator, and a harmonic oscillator.

9. The integrated circuit as recited in claim 1, wherein the VCO further comprises a VCO that generates an output frequency $F_{VCO}$ that is proportional to the square root of the oscillator bias current $I_{CELL}$.

10. The integrated circuit as recited in claim 1, further comprising a feedback divider coupled to the PLL output clock that generates the feedback signal connected to the feedback input of the PFD, wherein the frequency of the feedback signal is divided down by a divisor N from the frequency of the PLL output clock.

* * * * *